United States Patent [19]

Frass et al.

[11] Patent Number: 5,378,584
[45] Date of Patent: Jan. 3, 1995

[54] RADIATION-SENSITIVE RECORDING MATERIAL WITH A POSITIVE-WORKING, RADIATION-SENSITIVE LAYER HAVING A ROUGH SURFACE CONTAINING A SURFACTANT HAVING POLYSILOXANE UNITS

[75] Inventors: Hans W. Frass; Ernst-August Hackmann, both of Wiesbaden; Klaus Joerg, Ingelheim; Dietmar Koenneke, Taunusstein; Rudolf Neubauer, Oestrich-Winkel; Andreas Elsaesser, Idstein, all of Germany

[73] Assignee: Hoechst Aktiengesellschaft, Frankfurt am Main, Germany

[21] Appl. No.: 924,750

[22] Filed: Aug. 4, 1992

[30] Foreign Application Priority Data

Aug. 14, 1991 [DE] Germany .................. 4126836

[51] Int. Cl.$^6$ .................. G03F 7/023; G03F 7/30
[52] U.S. Cl. .................. 430/165; 430/191; 430/192; 430/193; 430/278; 430/302
[58] Field of Search .................. 430/165, 166, 191, 192, 430/193, 302, 278

[56] References Cited

U.S. PATENT DOCUMENTS

| | | | |
|---|---|---|---|
| 3,106,465 | 10/1963 | Neugebauer et al. | 96/33 |
| 3,180,733 | 4/1965 | Neugebauer et al. | 96/33 |
| 4,153,461 | 5/1979 | Berghäuser et al. | 96/75 |
| 4,216,289 | 8/1980 | Oda et al. | 430/302 |
| 4,251,620 | 2/1981 | Oda et al. | 430/300 |
| 4,266,001 | 5/1981 | Buhr et al. | 430/192 |
| 4,288,521 | 9/1981 | Kojima et al. | 430/169 |
| 4,288,526 | 9/1981 | Oda et al. | 430/272 |
| 4,371,602 | 2/1983 | Iwasaki et al. | 430/175 |
| 4,510,227 | 4/1985 | Mohr et al. | 430/192 |
| 4,560,636 | 12/1985 | Stahlhofen | 430/165 |
| 4,725,526 | 2/1988 | Frass et al. | 430/166 |
| 4,842,982 | 6/1989 | Seibel et al. | 430/156 |
| 4,957,845 | 9/1990 | Isono et al. | 430/166 |

FOREIGN PATENT DOCUMENTS

| | | |
|---|---|---|
| 1148014 | 6/1983 | Canada . |
| 0260943 | 3/1988 | European Pat. Off. . |
| 0344985 | 12/1989 | European Pat. Off. . |
| 75225548 | 7/1982 | Japan . |
| 1293161 | 10/1972 | United Kingdom . |
| 2043281 | 10/1980 | United Kingdom . |
| 2046461 | 11/1980 | United Kingdom . |
| 2075702 | 11/1981 | United Kingdom . |
| 2081919 | 11/1983 | United Kingdom . |
| 0011648 | 5/1984 | United Kingdom . |

OTHER PUBLICATIONS

Ullmann's Lexikon der technischen Chemie, Band 18, Kapitel "Füllstoffe", Jan. 11, 1980, pp. 651–652.
Bestimmung der Glätte nach BEKK, DIN 53 107, May 1982.
Darstellung von Korngrössenverteilungen, DIN 66 141, Feb. 1974.

*Primary Examiner*—Charles L. Bowers, Jr.
*Assistant Examiner*—John S. Chu
*Attorney, Agent, or Firm*—Foley & Lardner

[57] ABSTRACT

A radiation-sensitive recording material, in particular for producing planographic printing plates, is disclosed. The material is composed of a layer support and a positive-working, radiation-sensitive layer having a rough surface containing at least one 1,2-quinonediazide as a radiation-sensitive compound, a polycondensate or polymer as a binder insoluble in water and soluble or swellable in aqueous-alkaline solutions, a dye and a filler. At a layer weight of 3 g/m$^2$ or less, the radiation-sensitive layer comprises a silicic acid product having a mean grain size in the range from 3 to 5 μm with an exclusion limit of 15 μm as a filler in such a quantity that it exhibits a Bekk smoothness in the range from 20 to 100 seconds (determined according to DIN 53 107, Method A). The layer additionally comprises a surfactant having polysiloxane units. The recording material shows good copying properties and technical printing properties, such as an advantageous evacuation time, screen evenness, low susceptibility to air occlusions, good resolving power and a good coating structure. The invention also relates to a process for producing a planographic printing plated, using the recording material according to the invention.

20 Claims, No Drawings

RADIATION-SENSITIVE RECORDING MATERIAL WITH A POSITIVE-WORKING, RADIATION-SENSITIVE LAYER HAVING A ROUGH SURFACE CONTAINING A SURFACTANT HAVING POLYSILOXANE UNITS

BACKGROUND OF THE INVENTION

The present invention relates to a radiation-sensitive recording material, in particular for producing planographic printing plates, composed of a layer support and a positive-working, radiation-sensitive layer having a rough surface and containing at least one 1,2-quinonediazide as the radiation-sensitive compound and a polycondensate or polymer as a binder insoluble in water and soluble or swellable in aqueous-alkaline solutions and a filler.

Recording materials of this type are known. For planographic printing applications, the layer weight of the radiation-sensitive layer of these materials is generally below about 3 g/m$^2$, and the processing comprises process steps of bringing the film original and the recording material into contact by evacuation, exposing by means of UV light, developing with an alkaline developer, gumming the planographic printing plate produced and, if appropriate, baking the plate.

In order to ensure, on the one hand, rapid contacting of the film original and planographic printing plate and, on the other hand, to minimize air occlusions during the evacuation and/or adequately to ensure removal of the nitrogen during the diazo photolysis, i.e., to induce the uniform contacting that is required for an exact transfer of screen dots, it has proved to be advantageous to use materials having a rough surface.

A rough surface can be produced by the user immediately before the processing of the recording material, for example, by dusting with a powder. This procedure has, however, not gained acceptance for a variety of reasons, such as uneven copying results.

Attempts have therefore been made by the manufacturers of pre-sensitized planographic printing plates to provide their products during the manufacturing process with a defined rough surface. Thus, the embossing of the layer surface or the washing-out of water-soluble particles from the light-sensitive layer has already been disclosed (U.S. Pat. No. DE 1,813,445, corresponding to GB 1,293,161). It is also known to provide the layer with an added blowing agent that is activated during the drying process (EP 0,011,648, corresponding to U.S. Pat. No. 4,371,602). It is also known to add resins that agglomerate during the drying process to the light-sensitive layer (U.S. Pat. No. DE 2,948,737, corresponding to GB 2,043,281). None of these processes has, however, gained acceptance in the production of planographic printing plates.

On the other hand, the application of a dulling layer to the radiation-sensitive layer has proved to be a feasible approach such as, for example, the application of filled, developer-soluble dulling layers (U.S. Pat. No. DE 3,009,928, corresponding to GB 2,046,461). The application of unfilled, discontinuous dulling layers, applied by means of rollers having a rough surface, is also known (U.S. Pat. No. DE 2,606,793, corresponding to U.S. Pat. No. 4,216,289). Finally, developer-soluble dulling powders can also be dusted on and fixed (U.S. Pat. No. DE 3,003,131, corresponding to U.S. Pat. No. 4,288,521). It is also known to spray on aqueous solutions or dispersions of developer-soluble resins (U.S. Pat. No. DE 3,131,570, corresponding to GB 2,081,919) and to dry them. Dulling layers can also be sprayed on by an electrostatic method (EP 0,344,985). It is also known to spray on dulling layers that have essentially the same composition as the radiation-sensitive layer (U.S. Pat. No. DE 3,433,247, corresponding to U.S. Pat. No. 4,842,982).

By means of these techniques, it is possible to produce planographic printing plates that prove to be outstanding for processing in contact-printing. This is however, contrasted by the disadvantage that, even if developer-soluble dulling layers are used, a lower developing speed and an increased developer consumption are found, and considerable additional production costs arise due to the additional layer.

These points were the incentive for a search for possible ways of providing the radiation-sensitive, positive resist layer with a rough surface directly during the manufacturing process.

In U.S. Pat. No. DE 2,926,236 (corresponding to CA 1,148,014), the addition of inorganic or organic fillers having a mean particle diameter of 1 to 20 $\mu$m is described for this purpose.

It is also known that the advantage of easy dispersibility of the fillers insoluble in the coating solvents is obtained either if thermally cured phenol/formaldehyde resin is used as filler (U.S. Pat. No. DE 3,117,702, corresponding to GB 2,075,702) or if silica particles having a hydrophobic surface and a particle diameter of less than or equal to 0.5 $\mu$m are added to the above filler (JP 75 115,548).

None of these measures, however, has provided optimum results, since these materials are unable to meet the following requirements simultaneously:

(a) an evacuation time that is comparable to that obtained when a dulling layer is used, (b) a susceptibility to air occlusions that is low and a uniform screen transfer (screen evenness) as in the materials with dulling layers, (c) a resolving power and associated possibility of light correction, i.e., for film edge elimination by means of high exposure, without losses in fine-line parts or highlight parts, that is unaffected as much as possible, and (d) absence of halo formation around the filler particles or other cosmetic defects which adversely affect the functional behavior.

SUMMARY OF THE INVENTION

It is therefore an object of the present invention to provide a radiation-sensitive recording material for the production of planographic printing plates, that meets all of the above requirements and is also industrially easy and inexpensive to manufacture.

These and other objects according to the invention are provided by a radiation-sensitive recording material comprising a layer support and a positive-working, radiation-sensitive layer coated on the layer support, the radiation-sensitive layer having a layer weight of 3 g/m$^2$ or less and a rough surface having a Bekk smoothness in the range from 20 to 100 seconds, determined according to DIN 53 107, Method A. The radiation-sensitive layer comprises at least one radiation-sensitive 1,2-quinonediazide, a polycondensate or polymer as a binder insoluble in water and soluble or swellable in aqueous-alkaline solution, a surfactant having polysiloxane units, and a silicic acid product having a mean grain size in the range from 3 to 5 microns with an exclusion limit of 15 microns.

Also provided according to the invention is a planographic printing plate and a process for its production comprising the steps of evacuating a film original and the radiation-sensitive recording material in a vacuum contact-printing frame, exposing the recording material, developing the recording material with an aqueous-alkaline solution and gumming the planographic printing plate.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

A radiation-sensitive recording material according to the present invention has a radiation-sensitive layer comprising, at a layer weight of about 3 g/m$^2$ or less, a silicic acid product having a mean grain size in the range of from about 3 to 5 μm with an exclusion limit of about 15 μm as a filler in such a quantity that it exhibits a Bekk smoothness in the range from about 20 to 100 seconds (determined according to DIN 53 107, Method A). The layer additionally comprises a surfactant having polysiloxane units. Preferably, the radiation-sensitive layer has a layer weight in the range from about 1.5 to 2.5 g/m$^2$. The silicic acid product is preferably present in such a quantity that the Bekk smoothness of the layer is in the range of from about 20 to 80 seconds. Preferably, the silicic acid product has been rendered hydrophobic, in particular by wax or by means of chemical modification with silanes. The surfactant is preferably present in a quantity in the range between about 0.01 and 2 percent by weight, relative to the dry weight of the layer.

The silicic acid products used are synthetic silicic acids and silicates according to DIN 55 921. Accordingly, either pure SiO$_2$ or silicic acids containing metal oxides can be used, even if a precise distinction between these two is not possible. Therefore, this term "silicic acid product" approaches the usual expression "silica" which does not, or not always, make a distinction between silicic acids and silicates. The silicic acid products used can, for example, be Syloid ® types made by Grace, Silcron ® made by Lanco, Gasil ® made by Crosfield, OK/HK types made by Degussa and Satintone ® made by Engelhard-Chemie.

The mean grain size is to be understood as the 50% value of the cumulative mass or volume distribution curve, as set forth in the corresponding DIN instructions 66 141. The exclusion limit is the 100% value.

These instructions contain the fundamentals for representing grain (particle) size distributions. They are applicable to all granular materials, independently of the type of the measured fineness feature.

Various methods are available for determining the characteristic values, such as sedimentation measurements, image-analytical evaluation of electron micrographs, conductivity measurements and light scattering.

The quantities of the silicic acid product filler that are required to regulate Bekk smoothness values in the range of from about 20 to 100 seconds, preferably about 20 to 80 seconds, vary widely. They depend, in addition to the mean particle size, on the layer weight of the radiation-sensitive layer and on the roughness of the layer support surface.

The Bekk smoothness is determined according to DIN 53 107, Method A, in which the time is measured during which the pressure in the vacuum container for the measurement sample rises from $-507$ mbar to $-489$ mbar due to the air volume drawn through.

The silicic acid product is preferably present in a quantity ranging between about 0.01 and 10 and especially between about 0.1 and 5 percent by weight, relative to the dry weight of the layer.

The silicic acid products used as fillers are preferably rendered hydrophobic in order to obtain easier dispersibility. This is preferably achieved by coating, for example, with wax, or by chemical modification, for example, with silanes.

The surfactants used are preferably dialkylsiloxanes, that additionally can have been modified by alkylene oxide units or acid units. The quantity required for faultless coating without halo formation depends on the quantity of filler. As a rule, about 0.01 to 2, and especially about 0.05 to 1 percent by weight, relative to the dry weight of the layer, is sufficient. Products such as Tegopren ® made by Th. Goldschmidt AG, Edaplan ® (Münzing), Byk (Byk-Chemie), Baysilon Type ® (Bayer AG) or also various silicone oils made by Wacker-Chemie are mentioned as examples of surfactants used.

Preferably, 1,2-naphthoquinone-2-diazide-4- or -5-sulfonyl derivatives are used as the 1,2-quinonediazide. The esters are particularly preferred. Suitable naphthoquinonediazides are known from U.S. Pat. No. DE 938,233 (corresponding to U.S. Pat. No. 3,106,465 and U.S. Pat. No. 3,180,733) and U.S. Pat. No. DE 2,828,037 (corresponding to U.S. Pat. No. 4,266,001). The quantity of the naphthoquinonediazide compounds in the radiation-sensitive layer is generally between about 3 and 50, and preferably between about 8 and 25, percent by weight, relative to the content of the nonvolatile constituents.

The novolak polycondensates, proven in many positive copying materials based on 1,2-quinonediazides, have here again proved to be advantageous as binders. The novolaks additionally can have been modified in a known manner by reaction of a part of their hydroxyl groups with, for example, chloroacetic acid, isocyanates, epoxides or carboxylic acid anhydrides. Further alkali-soluble or alkali-swellable binders are polyhydroxyphenyl resins that are prepared by condensation from phenols and aldehydes or ketones, or polymers or copolymers of styrene and maleic anhydride, or polyvinylphenols. Advantageously, a polymer or copolymer of an acrylic or methacrylic acid ester with a polyhydric phenol can be used. The nature and quantity of the alkali-soluble resin can differ depending on the intended use; preferably, proportions of between about 90 and 30, and especially between about 85 and 55, percent by weight of total solids are preferred.

The binders used are preferably those that have a content of phenolic hydroxyl groups in the range from about 1 to 15 mmol/g and a molecular weight below about 100,000, especially in the range from about 5,000 to 100,000.

Numerous other resins can also be used in combination. The combination of a cresol/formaldehyde novolak and an unplasticized, preferably alkyl-etherified melamine/formaldehyde resin has proved to be particularly advantageous. In addition, epoxy resins and vinyl copolymers of the monomers on which they are based, and hydrogenated or partially hydrogenated colophony derivatives can also be present as resins. The advantageous proportion of these resins depends on the application requirements and on the effect on the development conditions. The proportion is generally not more than about 40, and preferably about 1 to 20, percent by weight, relative to alkali-soluble binder. For special requirements, such as flexibility, adhesion, gloss and coloration, the radiation-sensitive layer can also contain small quantities of substances such as polyglycols, cellulose derivatives such as ethylcellulose, wetting agents, dyes, adhesion promoters and finely disperse pigments and also, if required, UV absorbers.

For the color change after exposure, small quantities of radiation-sensitive components that, on exposure, preferably generate or release strong acids and, in a secondary reaction with a suitable dye, cause a color change, can also be added to the radiation-sensitive layer. Preferred dyes are cationic triarylmethane dyes and methine dyes. The radiation-sensitive components are, for example, 1,2-naphthoquinonediazide-4-sulfonic acid chloride, chromophorically-substituted halogenomethyl-s-triazines or diazonium compounds in the form of their salts with complex acids such as tetrafluoboric acid or hexafluorophosphoric acid.

For coating a suitable layer support, i.e., for producing the light-sensitive recording material, the mixture is generally dissolved in a solvent. The choice of solvent must be matched to the intended coating method, to the layer thickness and to the drying conditions. Suitable solvents are ketones such as methyl ethyl ketone, chlorinated hydrocarbons such as trichloroethylene and 1,1,1-trichloroethane, alcohols such as n-propanol, ethers such as tetrahydrofuran, alcohol ethers such as ethylene glycol monoalkyl ethers and propylene glycol monoalkyl ethers, and esters such as butyl acetate or propylene glycol alkyl ether-acetate. Mixtures can also be used that additionally, for special purposes, contain solvents such as acetonitrile, dioxane or dimethylformamide. In principle, all solvents can be used that do not react irreversibly with the layer components. Partial ethers of glycols, especially ethylene glycol monomethyl ether and propylene glycol methyl ether, are particularly preferred.

The layer supports used in most cases are metals. The following are used preferably for offset printing plates: bright-rolled, mechanically or electrochemically roughened aluminum which may have been anodized and which additionally can have been pretreated chemically, for example, with polyvinylphosphonic acid, silicates, phosphates, hexafluorozirconates or with hydrolyzed tetraethyl orthosilicate.

The coating of the layer support is effected in a known manner by skin-coating, spraying, dipping, roller application, by means of slot dies, blade-application or coater application. The exposure is carried out with the light sources usual in industry.

For development, aqueous-alkaline solutions of graded alkalinity are used, preferably having a pH in the range from 10–14, which can also contain small quantities of organic solvents or wetting agents.

To produce a printing form, the light-sensitive recording material is imagewise exposed under a positive original in a vacuum printing frame and then developed by means of an aqueous-alkali developer. Tube lamps, pulsed xenon lamps, metal halide-doped mercury vapor lamps or carbon arc lamps can be used for the imagewise exposure.

The invention also relates to a process for producing a planographic printing plate by evacuating the film original and the radiation-sensitive recording material in a vacuum printing frame, exposing, developing with an aqueous-alkaline solution and gumming, which process comprises using a recording material according to the invention.

As a result of the invention, the requirements in practice with respect to the evacuation times, screen evenness, low susceptibility to air occlusions, resolving power and faultless coating structure are all met simultaneously. Due to the presence of surfactant, there is no halo formation.

The invention is explained in more detail by reference to the following Examples, without being limited thereto, and Comparison Examples are marked with an *. P.b.w.=parts by weight.

The abbreviations used are defined as follows:
D Mean grain size in $\mu$m.
A Exclusion limit in $\mu$m.
G Bekk smoothness value in seconds.
T Evacuation time in seconds for the film original/planographic printing plate contacting.
R Screen evenness. The uniformity of the reproduction of a large-area 60's screen with 20% area coverage is evaluated visually:
  + =no chipped points,
  0=a few single chipped points, slight screen unevenness,
  − =many chipped points, pronounced screen unevenness.
Corona=width of the zone in mm around a 300 $\mu$m thick spacer between the printing plate and 60's screen film with 20% area coverage, in which the screen dots are not reproduced. In this test, the susceptibility to air occlusions is examined.
K Number of the first fully reproduced line (from 1 to 40) in Field 3 of the FOGRA contact control strip. Microline indication in the UGRA offset test wedge. Halo formation around fillers:
U Microline indication in the UGRA offset test wedge.
H Halo formation around fillers:
  + =absent
  − =present

EXAMPLE 1

A 0.3 mm thick aluminum foil electrolytically roughened (Rz value according to DIN 4768: 5.0 $\mu$m) in hydrochloric acid, interstage-pickled in sulfuric acid and anodized in sulfuric acid (oxide weight 4.0 g/m$^2$) is rendered hydrophilic with polyvinylphosphonic acid according to U.S. Pat. No. DE 1,621,478 (=U.S. Pat. No. 4,153,461) and then coated with the following resist solution:

5.00 p.b.w. of a cresol/formaldehyde novolak resin having a hydroxyl number of 420 according to DIN 53 783/53 240 and a GPC weight-average value of 10,000 (polystyrene standard),
1.20 p.b.w. of the esterification product of 3 mol of 1,2-naphthoquinone-2-diazide-5-sulfonylchloride and 1 mol of 2,3,4-trihydroxybenzophenone,
0.15 p.b.w. of 1,2-naphthoquinone-2-diazide-4-sulfonyl chloride,
0.05 p.b.w. of Victoria pure blue (C.I. 44 045), and x p.b.w. of silicic acid filler Syloid ® made by Grace, according to Table 1 relative to the dry weight of the resulting radiation-sensitive layer, y p.b.w. of surfactant based on units of dimethylsiloxane and alkylene oxide, Edapian ®LA, made by Münzing, Heilbronn, quantity according to Table 1 relative to the dry weight of the resulting radiation-sensitive layer, made up to 100 p.b.w. with a 40/60 solvent mixture of methyl ethyl ketone and propylene glycol monomethyl ether.

The resist film is dried for 1 minute at 125° C. The layer weight is 2.4 g/m².

The planographic printing plates produced are processed as follows:

The plates are contacted in a vacuum contact printing frame by evacuation with a flat of the test originals, and exposed with a 5 kW metal halide-doped mercury vapor lamp at a distance of 110 cm such that, after development, an open stage 4 results in the UGRA offset test wedge, corresponding to a high exposure for eliminating film edges. Development is carried out for 30 seconds in a potassium silicate developer having a total alkaline content of 0.95 mol/l.

The results reproduced in the attached Table 1 show that, using the recording materials according to the invention, the requirements regarding evacuation times (T), screen evenness (R) and low susceptibility to air occlusions (C,K), resolving power (U) and faultless coating structure (H) can be met simultaneously, in contrast to the known materials.

TABLE 1

| x | y | D | A | G | T | R | C | K | U | H |
|---|---|---|---|---|---|---|---|---|---|---|
| * | dulled planographic printing plate | | | | 20 | + | 2.0 | 9 | 15 | |
| *— | — | — | — | 600 | 50 | — | 7.0 | 23 | 15 | |
| *5 | 0.1 | 2 | <15 | 130 | 30 | 0 | 2.5 | 12 | 15 | + |
| *0.5 | 0.1 | 3 | <15 | 150 | 30 | 0 | 2.6 | 12 | 15 | + |
| *1.0 | 0.1 | 3 | <15 | 120 | 28 | 0 | 2.4 | 11 | 15 | + |
| 2.0 | 0.1 | 3 | <15 | 90 | 23 | + | 2.1 | 10 | 15 | + |
| 5.0 | 0.1 | 3 | <15 | 50 | 20 | + | 2.1 | 9 | 15 | + |
| 0.5 | 0.1 | 4 | <15 | 90 | 22 | + | 2.1 | 10 | 15 | + |
| 1.0 | 0.1 | 4 | <15 | 50 | 20 | + | 2.1 | 9 | 15 | + |
| 1.0 | 0.1 | 4(1) | <15 | 55 | 20 | + | 2.1 | 9 | 15 | + |
| *1.0 | — | 4 | >15 | 50 | 20 | + | 2.1 | 9 | 15 | — |
| 0.5 | 0.1 | 5 | <15 | 80 | 21 | + | 2.1 | 9 | 15 | + |
| 1.0 | 0.1 | 5 | <15 | 30 | 20 | + | 2.0 | 9 | 15 | + |
| *1.0 | 0.1 | 5 | <15 | 18 | 20 | + | 2.0 | 9 | 20 | + |
| *0.5 | 0.1 | 6 | <15 | 60 | 20 | + | 2.0 | 9 | 20 | + |

*comparison examples
(1) = filler rendered hydrophobic by coating with PE wax

EXAMPLE 2

A 0.3 mm thick aluminum foil electrolytically roughened (Rz value according to DIN 4768: 3.2 μm) in hydrochloric acid, interstage-pickled in sulfuric acid and anodized in sulfuric acid (oxide weight 2.0 g/mz) is rendered hydrophilic with polyvinylphosphonic acid according to U.S. Pat. No. DE 1,621,478 (=U.S. Pat. No. 4,153,461) and then coated with the following resist solution:

4.80 p.b.w. of a cresol/formaldehyde novolak resin having a hydroxyl number of 420 according to DIN 53 783/53 240 and a GPC weight-average value of 10,000 (polystyrene standard), 1.05 p.b.w. of the esterification product of 3 mol of 1,2-naphthoquinone-2-diazide-4-sulfonylchloride and 1 mol of 2,3,4-trihydroxybenzophenone, 0.05 p.b.w. of 2-(4-styrylphenyl)-4,6-bis-trichloromethyl-s-triazine, 0.10 p.b.w. of crystal violet (C.I. 42 555) and x p.b.w. of silicic acid filler (Syloid ® made by Grace) corresponding to Table 2, y p.b.w. of surfactant based on units of dimethylsiloxane and alkylene oxide, (Tegopren ® made by Th. Goldschmidt AG), quantity according to Table 2, made up to 100 p.b.w. by a 55/45 solvent mixture of tetrahydrofuran and propylene glycol monomethyl ether.

The resist film is dried for 1 minute at 125° C. The layer weight is 1.8 g/m².

The processing of the planographic printing plates produced with a reversible positive layer is carried out as described in Example 1.

The results reproduced in Table 2 confirm the results, described under Example 1, for this recording material according to the invention.

TABLE 2

| x | y | D | A | G | T | R | C | K | U | H |
|---|---|---|---|---|---|---|---|---|---|---|
| * | dulled planographic printing plate | | | | 20 | + | 2.0 | 9 | 15 | |
| *— | — | — | — | 650 | 52 | — | 6.8 | 21 | 15 | |
| *5 | 0.1 | 2 | <15 | 140 | 30 | 0 | 2.4 | 12 | 15 | + |
| *0.5 | 0.1 | 3 | <15 | 145 | 30 | 0 | 2.6 | 12 | 15 | + |
| *1.0 | 0.1 | 3 | <15 | 115 | 27 | 0 | 2.4 | 11 | 15 | + |
| 2.0 | 0.1 | 3 | <15 | 85 | 22 | + | 2.1 | 10 | 15 | + |
| 5.0 | 0.1 | 3 | <15 | 45 | 20 | + | 2.1 | 9 | 15 | + |
| 0.5 | 0.1 | 4 | <15 | 90 | 22 | + | 2.1 | 10 | 15 | + |
| 1.0 | 0.1 | 4 | <15 | 50 | 20 | + | 2.1 | 9 | 15 | + |
| 1.0 | 0.1 | 4(1) | <15 | 50 | 20 | + | 2.1 | 9 | 15 | + |
| *1.0 | — | 4 | <15 | 50 | 20 | + | 2.1 | 9 | 15 | — |
| 0.5 | 0.1 | 5 | <15 | 70 | 21 | + | 2.1 | 9 | 15 | + |
| 1.0 | 0.1 | 5 | <15 | 35 | 20 | + | 2.0 | 9 | 15 | + |
| *1.0 | 0.1 | 5 | >15 | 20 | 20 | + | 2.0 | 9 | 20 | + |
| *0.5 | 0.1 | 6 | <15 | 50 | 20 | + | 2.0 | 9 | 20 | + |

*comparison examples
(1) = filler rendered hydrophobic by coating with PE wax

What is claimed is:

1. A radiation-sensitive recording material comprising:

a layer support; and a positive-working, radiation-sensitive layer coated on said layer support, said radiation-sensitive layer having a layer weight of 3 g/m² or less and a rough surface having a Bekk smoothness in the range from 20 to 100 seconds, determined according to DIN 53 107, Method A, said radiation-sensitive layer comprising:

at least one radiation-sensitive 1,2-quinonediazide, which is a 1,2-naphthoquinone-2-diazide-4- or -5-sulfonyl derivative, a polycondensate or polymer as a binder insoluble in water and soluble or swellable in aqueous-alkaline solution, a surfactant having polysiloxane units, wherein the surfactant is present in an amount effective to minimize halo formation and a silicic acid product having a mean grain size in the range from 3 to 5 microns with an exclusion limit of 15 microns, wherein the silicic acid product is present in an amount effective to give a rough surface having said Bekk smoothness.

2. The material as claimed in claim 1, wherein the radiation-sensitive layer has a layer weight in the range from 1.5 to 2.5 g/m$^2$.

3. The material as claimed in claim 1, having a Bekk smoothness in the range of from about 20 to 80 seconds.

4. The material as claimed in claim 1, wherein the silicic acid product is present in an amount between about 0.01 and 10 percent by weight, relative to the dry weight of the layer.

5. The material as claimed in claim 1, wherein the silicic acid product is present in an amount between about 0.1 and 5 percent by weight.

6. The material as claimed in claim 1, wherein the silicic acid product has been rendered hydrophobic.

7. The material as claimed in claim 6, wherein the silicic acid product has been rendered hydrophobic by wax or by chemical modification with a silane.

8. The material as claimed in claim 1, wherein the surfactant is present in an amount between about 0.01 and 2 percent by weight, relative to the dry weight of the layer.

9. The material as claimed in claim 1, wherein the surfactant is a dialkylsiloxane, optionally modified by alkylene oxide units.

10. The material as claimed in claim 1, wherein the binder has a content of phenolic hydroxyl groups in the range of from about 1 to 15 mmol/g and a molecular weight of less than about 100,000.

11. The material as claimed in claim 1, wherein the layer further comprises a component which forms a strong acid under the action of actinic radiation, and a dye which shows a color change under the action of said acid.

12. The material as claimed in claim 11, wherein the dye is selected from the group consisting of a cationic triarylmethane dye and a methine dye.

13. A planographic printing plate comprising a material as claimed in claim 1.

14. The material as claimed in claim 1, wherein the radiation-sensitive layer consists essentially of the recited ingredients.

15. The material as claimed in claim 1, wherein the 1,2-quinonediazide is a 1,2,-naphthoquinone-2-diazide-4- or -5-sulfonyl ester.

16. The material as claimed in claim 1, wherein the binder comprises a novolak resin.

17. The material as claimed in claim 1, wherein the layer support comprises a metal support.

18. The material as claimed in claim 1, wherein the layer support is a roughened aluminum support.

19. The material as claimed in claim 1, wherein the layer support is a roughened aluminum support which has further been anodized and rendered hydrophilic.

20. The material as claimed in claim 1, wherein the surfactant has units based on dialkylsiloxane and alkylene oxide.

* * * * *